US012494386B2

(12) United States Patent
Kikuchi et al.

(10) Patent No.: US 12,494,386 B2
(45) Date of Patent: Dec. 9, 2025

(54) ELECTRONIC COMPONENT CLEANING APPARATUS

(71) Applicant: Yamaha Robotics Co., Ltd., Tokyo (JP)

(72) Inventors: Hiroshi Kikuchi, Tokyo (JP); Kinn Ri, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 0 days.

(21) Appl. No.: 18/020,261

(22) PCT Filed: Mar. 30, 2022

(86) PCT No.: PCT/JP2022/016054
§ 371 (c)(1),
(2) Date: Feb. 7, 2023

(87) PCT Pub. No.: WO2023/188128
PCT Pub. Date: Oct. 5, 2023

(65) Prior Publication Data
US 2024/0258125 A1    Aug. 1, 2024

(51) Int. Cl.
*H01L 21/67*    (2006.01)
*B08B 3/02*    (2006.01)
(Continued)

(52) U.S. Cl.
CPC .......... *H01L 21/67051* (2013.01); *B08B 3/02* (2013.01); *B08B 7/0035* (2013.01);
(Continued)

(58) Field of Classification Search
CPC ......... H01L 21/67051; H01L 21/67034; H01L 21/67751; H01L 21/02; H01L 21/304;
(Continued)

(56) References Cited

U.S. PATENT DOCUMENTS 9,153,464 B2    10/2015    Kang et al.
2002/0013063 A1 *    1/2002    Kojima ............. H01L 21/02071
438/712

FOREIGN PATENT DOCUMENTS

DE    4414263 A1 *    10/1995    ........... B08B 7/0035
JP    2008518470    5/2008
(Continued)

OTHER PUBLICATIONS

DE4414263 translation (Year: 1995).*
(Continued)

*Primary Examiner* — Michael E Barr
*Assistant Examiner* — Lauren G Orta
(74) *Attorney, Agent, or Firm* — JCIPRNET

(57) ABSTRACT

An electronic component cleaning apparatus for cleaning a surface of a wafer includes: a wet cleaning unit, a dry cleaning unit, a transport unit and a control unit. The control unit; performs the wet cleaning of the surface of the wafer by the wet cleaning unit; transports the wafer that has been cleaned to the dry cleaning unit; performs the dry cleaning of the surface of the wafer with atmospheric pressure plasma by the dry cleaning unit; transports the wafer that has been dry-cleaned to the wet cleaning unit; and performs a hydrogen water treatment to hydrophilize the surface of the wafer using hydrogen water in which hydrogen gas is dissolved in water.

8 Claims, 15 Drawing Sheets

(51) Int. Cl.
  *B08B 7/00* (2006.01)
  *B23K 20/24* (2006.01)
  *H01L 21/02* (2006.01)
  *H01L 21/304* (2006.01)
  *H01L 21/52* (2006.01)
  *H01L 21/677* (2006.01)
  *H01L 21/683* (2006.01)
  *H01L 21/687* (2006.01)

(52) U.S. Cl.
  CPC .............. *B23K 20/24* (2013.01); *H01L 21/02* (2013.01); *H01L 21/304* (2013.01); *H01L 21/52* (2013.01); *H01L 21/67028* (2013.01); *H01L 21/67034* (2013.01); *H01L 21/67057* (2013.01); *H01L 21/677* (2013.01); *H01L 21/67751* (2013.01); *H01L 21/68742* (2013.01); *H01L 2221/68327* (2013.01)

(58) Field of Classification Search
  CPC .............. H01L 21/52; H01L 21/67028; H01L 21/67057; H01L 21/677; H01L 21/67178; H01L 21/6836; H01L 21/68742; H01L 2221/68327; B23K 20/24; B08B 3/02; B08B 7/0035
  See application file for complete search history.

(56) References Cited

FOREIGN PATENT DOCUMENTS

| | | | | |
|---|---|---|---|---|
| JP | 2012250232 | | 12/2012 | |
| JP | 2020155759 | | 9/2020 | |
| JP | 2020155759 A | * | 9/2020 | ....... H01L 21/68742 |
| WO | 2006047052 | | 5/2006 | |
| WO | 2010021020 | | 2/2010 | |
| WO | 2021132133 | | 7/2021 | |
| WO | WO-2021132133 A1 | * | 7/2021 | ............. H01L 21/52 |

OTHER PUBLICATIONS

JP2020155759 translation (Year: 2020).*
WO2021132133 translation (Year: 2021).*
"International Search Report (Form PCT/ISA/210) of PCT/JP2022/016054", mailed on Jul. 5, 2022, pp. 1-3.

* cited by examiner

ELECTRONIC COMPONENT CLEANING APPARATUS

CROSS-REFERENCE TO RELATED APPLICATION

This application is a 371 application of the International PCT application serial no. PCT/JP2022/016054, filed on Mar. 30, 2022. The entirety of the above-mentioned patent application is hereby incorporated by reference herein and made a part of this specification.

TECHNICAL FIELD

The present invention relates to the configuration of an electronic component cleaning apparatus that cleans surfaces of electronic components such as wafers, semiconductor chips, and substrates.

RELATED ART

When manufacturing semiconductor devices by bonding, it is necessary to clean the surfaces of wafers such as silicon wafers and compound semiconductor wafers. Patent Literature 1 discloses a bonding system that, when bonding two wafers, scrubs and cleans the surfaces of wafers by a cleaning apparatus, modifies the surfaces of the wafers by plasma treatment, and performs bonding after making the surfaces of the wafers hydrophilic with pure water.

CITATION LIST

Patent Literature

[Patent Literature 1] Japanese Patent Application Laid-Open No. 2020-155759

SUMMARY

Technical Problem

However, as in the conventional technology described in Patent Literature 1, after performing the surface modification treatment with plasma, when the surface of the wafer is subjected to hydrophilization treatment with pure water, the hydrophilicity of the surface may decrease with time, and the bonding quality may deteriorate.

Therefore, this disclosure maintains the hydrophilicity of the surface of an electronic component in a high state.

Solution to Problem

An electronic component cleaning apparatus according to the disclosure is an electronic component cleaning apparatus for cleaning a surface of an electronic component, and includes: a wet cleaning unit that performs wet cleaning of the surface of the electronic component with liquid; a dry cleaning unit that performs dry cleaning of the surface of the electronic component with atmospheric pressure plasma; a transport unit that transports the electronic component between the wet cleaning unit and the dry cleaning unit; and a control unit that adjusts operations of the wet cleaning unit, the dry cleaning unit, and the transport unit. The control unit performs the wet cleaning of the surface of the electronic component with liquid by the wet cleaning unit, transports the electronic component that has been wet-cleaned by the transport unit to the dry cleaning unit; performs the dry cleaning of the surface of the electronic component with atmospheric pressure plasma by the dry cleaning unit; transports the electronic component that has been dry-cleaned by the transport unit to the wet cleaning unit; and performs a hydrogen water treatment by the wet cleaning unit to hydrophilize the surface of the electronic component using hydrogen water in which hydrogen gas is dissolved in water.

In this way, by performing hydrophilization with the hydrogen water treatment after the dry cleaning with atmospheric pressure plasma, the hydrophilicity of the surface of the electronic component may be maintained in a high state, and the bonding quality may be improved.

In the electronic component cleaning apparatus according to the disclosure, the control unit may transport the electronic component that has been dry-cleaned from the dry cleaning unit to the wet cleaning unit by the transport unit to start the hydrogen water treatment immediately after the dry cleaning is completed. Here, the control unit may transport the electronic component that has been dry-cleaned from the dry cleaning unit to the wet cleaning unit by the transport unit to start the hydrogen water treatment within 30 seconds or within 10 seconds after the dry cleaning is completed.

In this way, the hydrophilicity of the surface of the electronic component may be maintained in a high state for a longer period of time.

In the electronic component cleaning apparatus according to the disclosure, the dry cleaning unit may be disposed above the wet cleaning unit to overlap at least a part of the wet cleaning unit, and the transport unit may be a stage that holds the electronic component on its upper surface and is driven in an up-down direction while holding the electronic component.

According to this configuration, it is possible to shorten the time for transporting the electronic component that has been dry-cleaned from the dry cleaning unit to the wet cleaning unit, and it is possible to start the hydrogen water treatment in a short time after the dry cleaning is completed. In this way, the hydrophilicity of the surface of the electronic component may be maintained in a high state, and the bonding quality may be improved.

In the electronic component cleaning apparatus according to the disclosure, the dry cleaning unit may be disposed above the wet cleaning unit to overlap at least a part of the wet cleaning unit; and the transport unit may be disposed adjacent to the wet cleaning unit and the dry cleaning unit, extend in an up-down direction across the wet cleaning unit and the dry cleaning unit, and transport the electronic component between the wet cleaning unit and the dry cleaning unit.

In the electronic component cleaning apparatus according to the disclosure, the electronic component may be a wafer, a semiconductor chip, or a substrate for a semiconductor device. Here, the semiconductor chip may be attached on a support material.

Effects of Invention

The disclosure may maintain the hydrophilicity of the surface of an electronic component in a high state.

DESCRIPTION OF THE EMBODIMENTS

Figure 1:
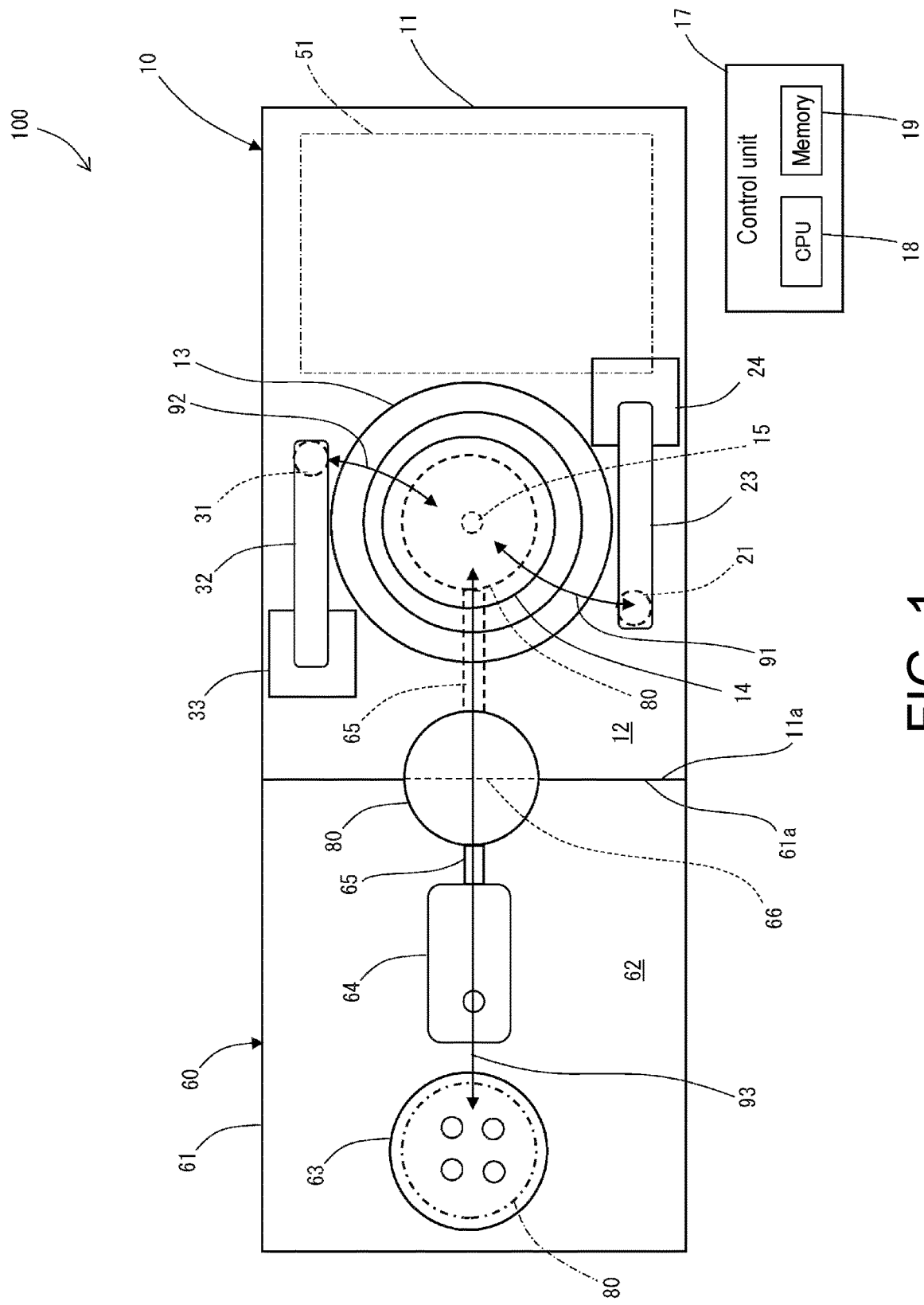
FIG. 1 is a plan view of the first floor of an electronic component cleaning apparatus of the embodiment.

Hereinafter, an electronic component cleaning apparatus 100 according to an embodiment will be described with reference to the drawings. In the following description, the electronic component cleaning apparatus 100 is used to clean a surface 81 of a wafer 80, which is an electronic component; however, the electronic component cleaning apparatus 100 may also clean a surface 89 of a semiconductor chip 85 (see FIG. 15), Cleaning may also be performed, and may also clean a surface of a substrate of a semiconductor device to which the semiconductor chip 85 is to be bonded.

Figure 2:
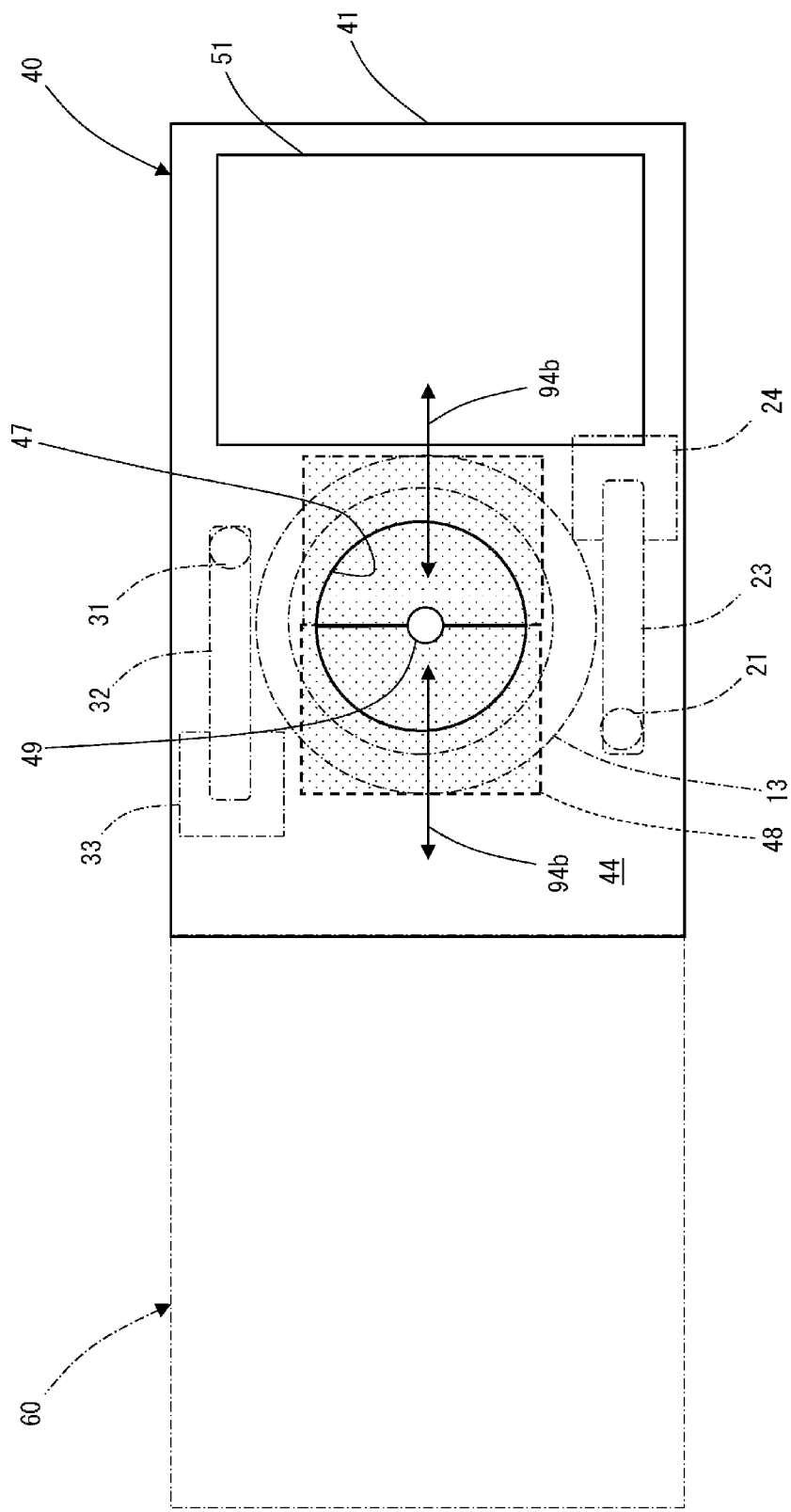
FIG. 2 is a plan view of the second floor of the electronic component cleaning apparatus of the embodiment.

As shown in FIGS. 1 and 2, the electronic component cleaning apparatus 100 has a two-story structure with the first floor shown in FIG. 1 and the second floor shown in FIG. 2. As shown in FIG. 1, a wet cleaning unit 10 and a horizontal transport unit 60 are disposed adjacent to each other on the first floor. Further, a control unit 17 is disposed on the first floor. A dry cleaning unit 40 is disposed on the second floor to overlap the wet cleaning unit 10 on top of it.

Figure 3:
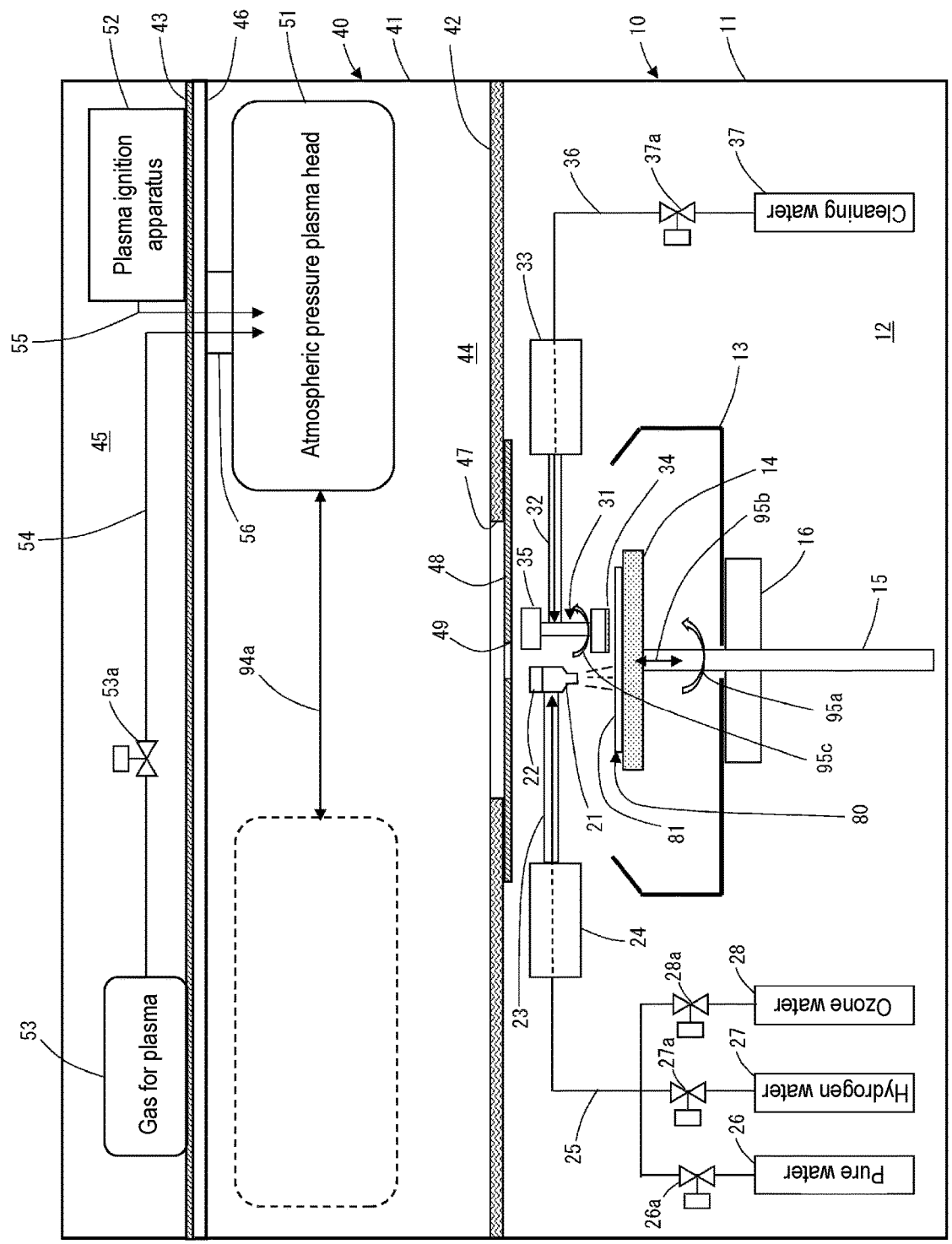
FIG. 3 is an elevation cross-sectional view of a wet cleaning unit and a dry cleaning unit of the electronic component cleaning apparatus of the embodiment.

As shown in FIGS. 1 and 3, the wet cleaning unit 10 includes a casing 11 in a substantially rectangular parallelepiped shape, a wet cleaning chamber 13 located within the interior 12 of the casing 11, a processing stage 14, a stage drive apparatus 16 for driving the processing stage 14, a water nozzle 21, an ultrasonic vibrator 22, a nozzle arm 23, a nozzle arm drive part 24, a wiping head 31, a head arm 32, a head arm drive part 33, a rotary pressing drive part 35, a wiping member 34, a pure water tank 26, a hydrogen water tank 27, an ozone water tank 28 and a cleaning water tank 37.

The processing stage 14 is a disk-shaped member that holds a wafer 80 on its upper surface. A shaft 15 is connected to the lower side of the processing stage 14. The shaft 15 is rotationally driven by the stage drive apparatus 16 as indicated by an arrow 95a in FIG. 3 and driven in the up-down direction as indicated by an arrow 95b in FIG. 3. Therefore, the processing stage 14 is rotated and driven in the up-down direction by the stage drive apparatus 16 while holding the wafer 80. The processing stage 14 configures a transport unit that transports the wafer 80 in the up-down direction between the wet cleaning chamber 13 of the wet cleaning unit 10 and dry cleaning chamber 44 of dry cleaning unit 40 when the shutter 48 is open as will be described later.

The water nozzle 21 is disposed above the processing stage 14 and sprays pure water, ozone water, and hydrogen water onto the wafer 80 held on the upper surface of the processing stage 14. The water nozzle 21 is attached to the tip of the nozzle arm 23. A root part of the nozzle arm 23 is connected to the nozzle arm drive part 24. The nozzle arm drive part 24 rotates and moves the nozzle arm 23 within a plane as indicated by an arrow 91 in FIG. 1 to move the water nozzle 21 attached to the tip of the nozzle arm 23 into and out of the upper surface of the processing stage 14. The ultrasonic vibrator 22 is attached to the upper part of the water nozzle 21 to apply ultrasonic vibration to pure water, hydrogen water, and ozone water sprayed from the water nozzle 21.

The wiping head 31 is disposed above the processing stage 14, drives and rotates the wiping member 34 attached to the lower end by the rotary pressing drive part 35 attached to the upper end in the direction of an arrow 95c shown in FIG. 3, and brings the wiping member 34 into contact with the upper surface of the wafer 80 to wipe and clean the surface 81 of the wafer 80. The wiping member 34 may be a woven or knitted fabric using, for example, microfibers. Further, the wiping head 31 incorporates a cleaning water nozzle for spraying cleaning water toward the wafer 80.

The wiping head 31 is attached to the tip of the head arm 32. A root part of the head arm 32 is connected to the head arm drive part 33. The head arm drive part 33 rotates and moves the head arm 32 within a plane as indicated by an arrow 92 in FIG. 1 to move the wiping head 31 attached to the tip of the head arm 32 in and out of the upper surface of the processing stage 14.

The wet cleaning chamber 13 is provided below the processing stage 14, has a circular shape that receives pure water, ozone water, hydrogen water sprayed from the water nozzle 21, or cleaning water sprayed from the wiping head 31, and has a narrow opening towards the top. The upper opening has a size that allows the wafer 80 to be taken in and out.

The pure water tank 26, the hydrogen water tank 27, and the ozone water tank 28 are tanks that store pure water, hydrogen water, and ozone water, respectively. Here, hydrogen water is water in which hydrogen gas is dissolved, and ozone water is water in which ozone gas is dissolved.

Instead of the hydrogen water tank 27 and the ozone water tank 28, a hydrogen water generator for generating hydrogen water and an ozone water generator for generating ozone water may be disposed. The cleaning water tank 37 stores cleaning water such as pure water, hydrogen water, alkali-added hydrogen water, carbonated water, and the like.

The pure water tank 26, the hydrogen water tank 27, and the ozone water tank 28 are connected to the water nozzle 21 by a pure water valve 26a, a hydrogen water valve 27a, an ozone water valve 28a, and a pipe 25, respectively. Further, the cleaning water tank 37 is connected to the wiping head 31 by a cleaning water valve 37a and a pipe 36.

As shown in FIG. 1, a horizontal transport unit 60 is disposed adjacent to the wet cleaning unit 10 on the first floor. The horizontal transport unit 60 includes a casing 61, a wafer transfer stage 63 disposed in the interior 62 of the casing 61, a horizontal transport robot 64 as a horizontal transport apparatus, and a hand 65. The wafer transfer stage 63 is a stage that receives an uncleaned wafer 80 from the outside and delivers a cleaned wafer 80. A side wall 11a of the casing 11 of the wet cleaning unit 10 and a side wall 61a of the horizontal transport unit 60 are provided with an opening 66 for transporting the wafer 80 between the horizontal transport unit 60 and the wet cleaning unit 10. The horizontal transport robot 64 transports the wafer 80 held by the hand 65 between the wafer transfer stage 63 and the processing stage 14 of the wet cleaning unit 10 through the opening 66 as indicated by an arrow 93 in FIG. 1.

As shown in FIGS. 2 and 3, the dry cleaning unit 40 includes a casing 41 which is in a substantially rectangular parallelepiped shape and is disposed to overlap the casing 11 of the wet cleaning unit 10 on top of it, a floor plate 42, a ceiling plate 43, a ceiling rail 46, an atmospheric pressure plasma head 51, a plasma ignition apparatus 52, a plasma gas tank 53 and a plasma head drive part 56.

A space partitioned by the walls of the casing 41, the floor plate 42, and the ceiling plate 43 configures a dry cleaning chamber 44 in which dry cleaning treatment is performed by the atmospheric pressure plasma sprayed from the atmospheric pressure plasma head 51. In addition, the space above the ceiling plate 43 configures an equipment installation space 45 into which the atmospheric pressure plasma does not enter.

The atmospheric pressure plasma head 51 may be, for example, an apparatus in which multiple plasma generators are disposed side by side, which includes a ceramic tube through which gas for plasma flows, a negative electrode disposed outside the ceramic tube, and a ground electrode disposed inside the ceramic tube, and in which a high voltage is applied between the negative electrode and the ground electrode to generate discharge in the ceramic tube and plasma is sprayed from the tip thereof. The atmospheric pressure plasma head 51 is attached to the ceiling rail 46 via the plasma head drive part 56. The plasma head drive part 56 reciprocally moves the atmospheric pressure plasma head 51 in the horizontal direction as indicated by an arrow 94a in FIG. 3.

Figure 8:
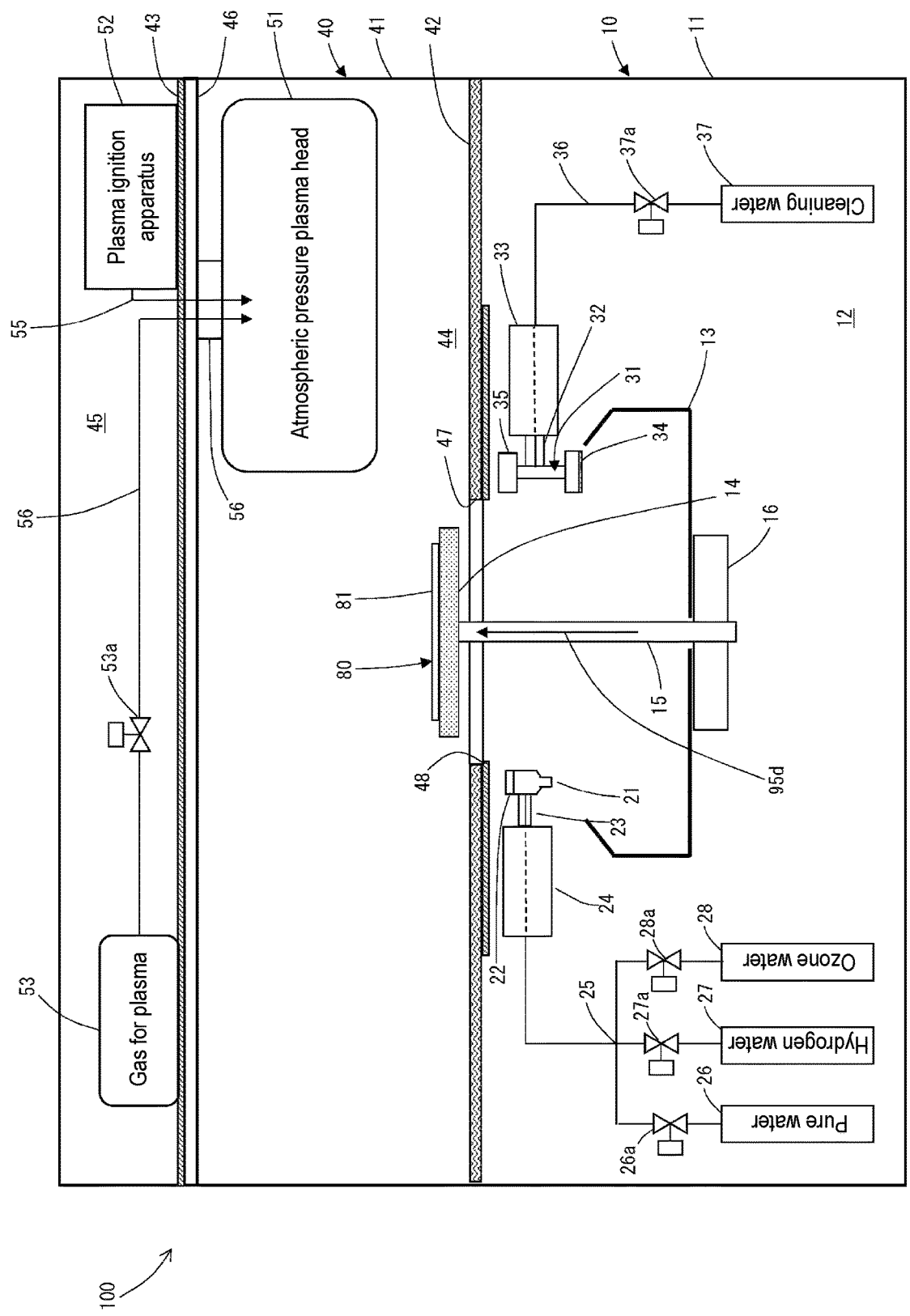
FIG. 8 is a view showing the operation of the electronic component cleaning apparatus shown in FIG. 3, and is an elevation cross-sectional view showing a state in which the wafer is moved from the wet cleaning chamber to the dry cleaning chamber.

At the center of the floor plate 42 and above the processing stage 14 of the wet cleaning unit 10 disposed on the lower side, an opening 47 that allows the processing stage 14 to move in the up-down direction is provided. A shutter 48 for opening and closing the opening 47 is provided below the floor plate 42. The shutter 48 is slid by a drive part (not shown) as indicated by an arrow 94b in FIG. 2 to open and close the opening 47. When the shutter 48 is opened, as shown in FIG. 8, the processing stage 14 of the wet cleaning unit 10 may move upward as indicated by an arrow 95d from the wet cleaning chamber 13 into the dry cleaning chamber 44. The shutter 48 is closed after the processing stage 14 moves into the dry cleaning chamber 44. At this time, a semicircular notch 49 (see FIG. 2) is provided in the center of two mating surfaces of the shutter 48 to form an opening through which the shaft 15 may pass between the wet cleaning unit 10 and the dry cleaning unit 40.

The plasma ignition apparatus 52 is an apparatus that supplies a high voltage to electrodes disposed inside the atmospheric pressure plasma head 51, and is connected to the atmospheric pressure plasma head 51 by a connection line 55.

The plasma gas tank 53 is a tank that stores gas for plasma. As the gas for plasma, an inert gas such as argon, helium and the like may be used. The plasma gas tank 53 and the atmospheric pressure plasma head 51 are connected by a plasma gas valve 53a and a pipe 54.

Figure 4:
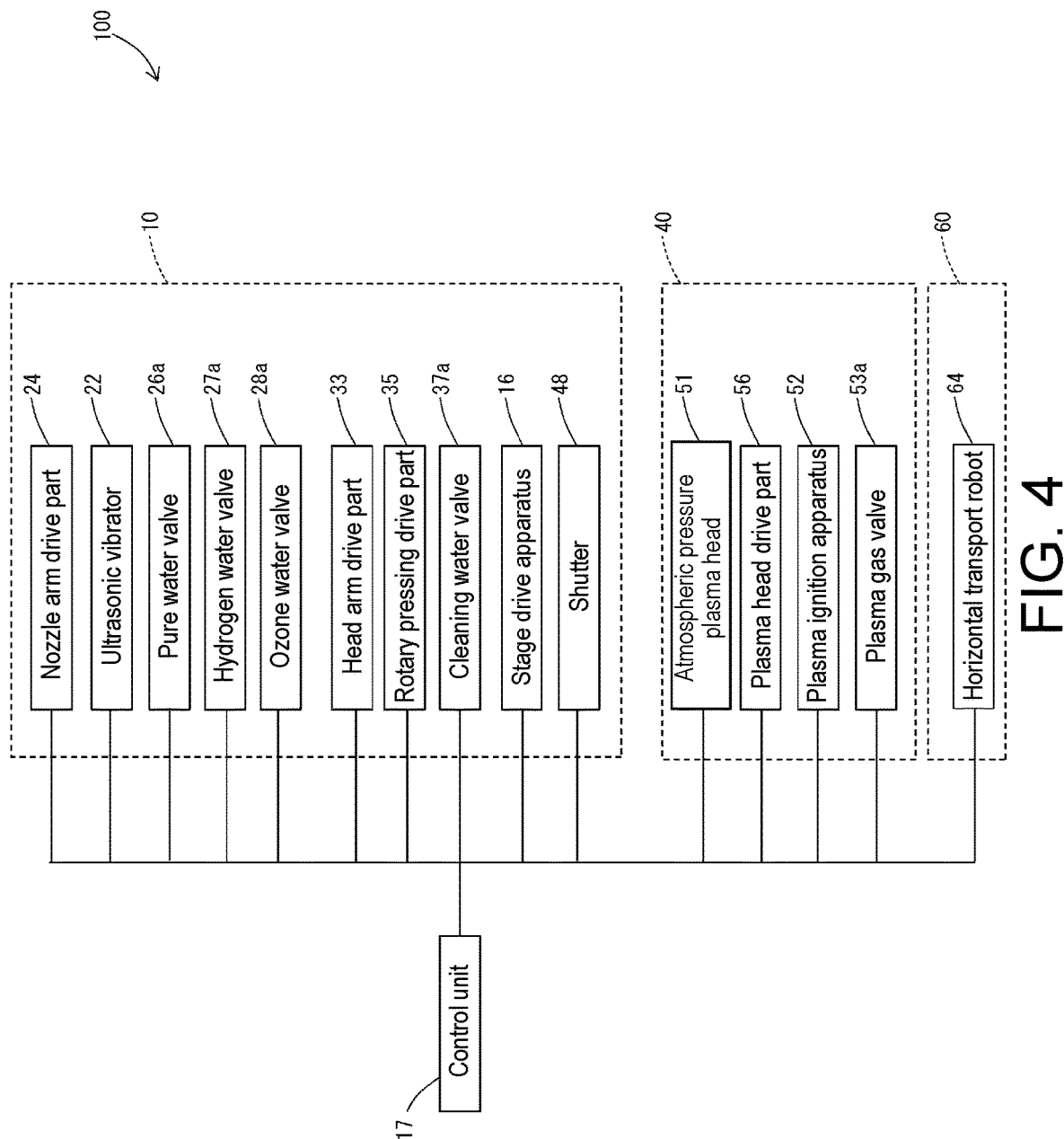
FIG. 4 is a system view showing a control system of the electronic component cleaning apparatus of the embodiment.

The control unit 17 is a computer including a CPU 18 and a memory 19. As shown in FIG. 4, the control unit 17 is connected to the nozzle arm drive part 24 of the wet cleaning unit 10, the ultrasonic vibrator 22, the pure water valve 26a, the hydrogen water valve 27a, the ozone water valve 28a, the head arm drive part 33, the rotary pressure drive part 35, the cleaning water valve 37a, the stage drive apparatus 16, and the shutter 48 to adjust the operation of each equipment of the wet cleaning unit 10 and the processing stage 14 that configures the transport unit. Further, the control unit 17 is connected to the atmospheric pressure plasma head 51, the plasma head drive part 56, the plasma ignition apparatus 52, and the plasma gas valve 53a to adjust the operation of each equipment of the dry cleaning unit 40. Further, the control unit 17 is connected to the horizontal transport robot 64 of the horizontal transport unit 60 to adjust the operation of the horizontal transport robot 64.

Next, the cleaning operation of the wafer 80 of the electronic component cleaning apparatus 100 configured as described above will be described with reference to FIGS. 5 to 10.

Figure 6:
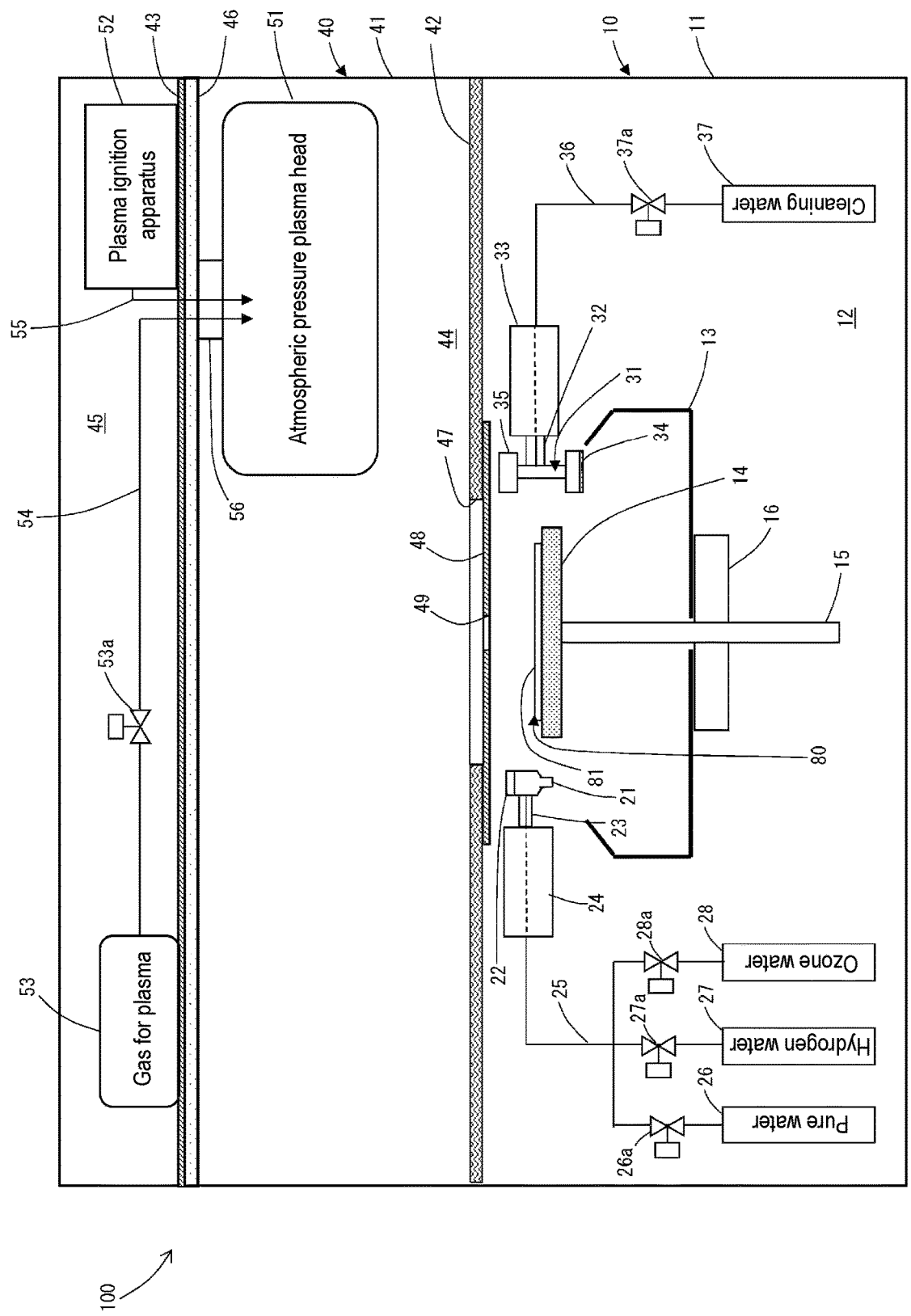
FIG. 6 is a view showing the operation of the electronic component cleaning apparatus shown in FIG. 3, and is an elevation cross-sectional view showing a state in which a wafer is held on a processing stage.

As shown in FIG. 6, in the initial state, the shutter 48 is closed, and the wet cleaning unit 10 and the dry cleaning unit 40 are partitioned by the floor plate 42 and the shutter 48 of the casing 41 of the dry cleaning unit 40. Further, as shown in FIG. 1, the nozzle arm 23 and the head arm 32 retract the water nozzle 21 and the wiping head 31 to a position where they do not overlap the processing stage 14.

Figure 5:
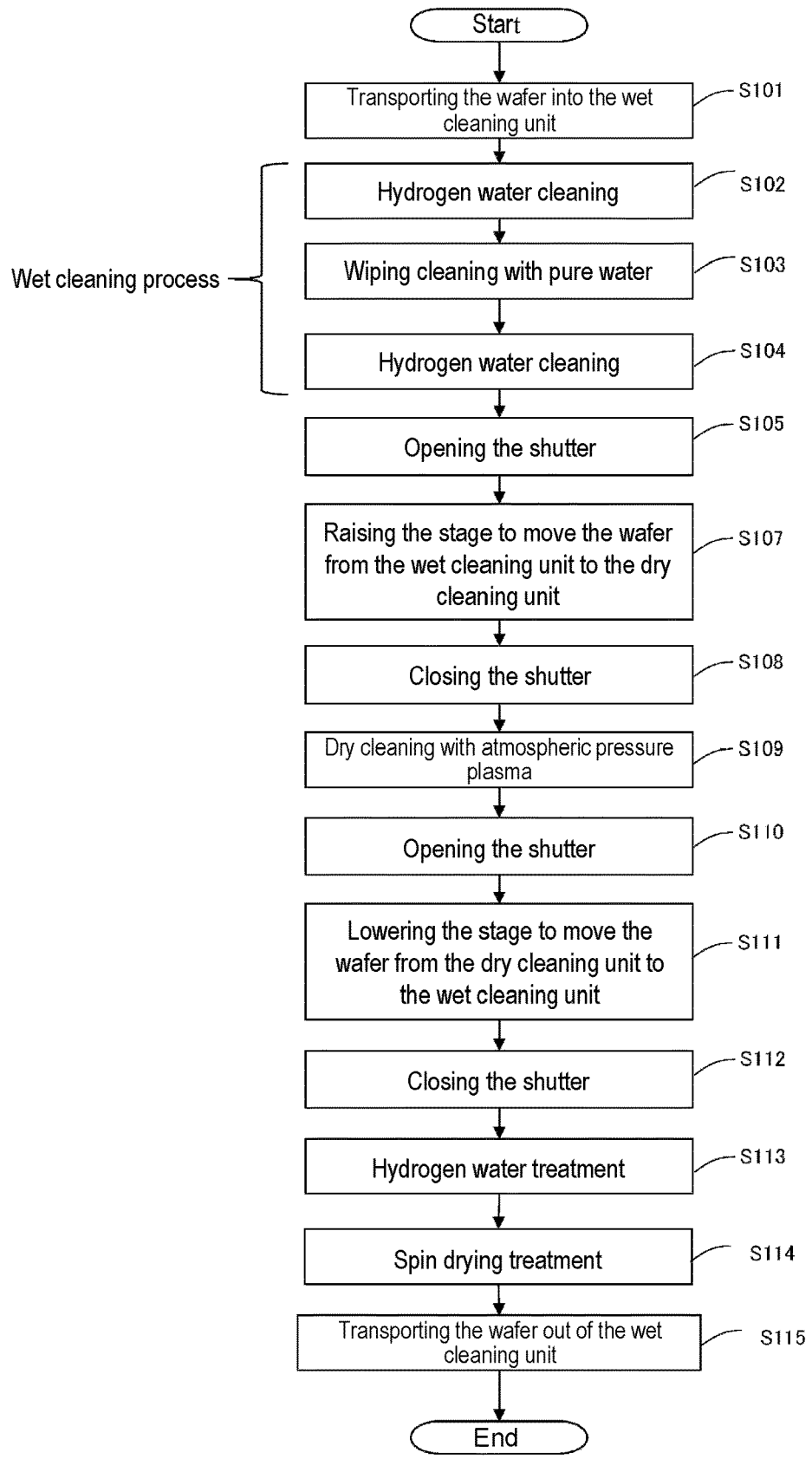
FIG. 5 is a flow chart showing the operation of the electronic component cleaning apparatus of the embodiment.

As shown in step S101 of FIG. 5, the control unit 17 operates the horizontal transport robot 64 shown in FIG. 1 to pick up the uncleaned wafer 80 placed on the wafer transfer stage 63 of the horizontal transport unit 64, transports it into the wet cleaning unit 10 as shown in FIG. 6, and places it on the processing stage 14. The control unit 17 causes the upper surface of the processing stage 14 to hold the wafer 80.

The control unit 17 performs wet cleaning of the surface 81 of the wafer 80 in steps S102 to S104 of FIG. 5. Here, steps S102 to S104 of FIG. 5 configure a wet cleaning process. First, the control unit 17 executes hydrogen water cleaning as shown in step S102 of FIG. 5.

Figure 7:
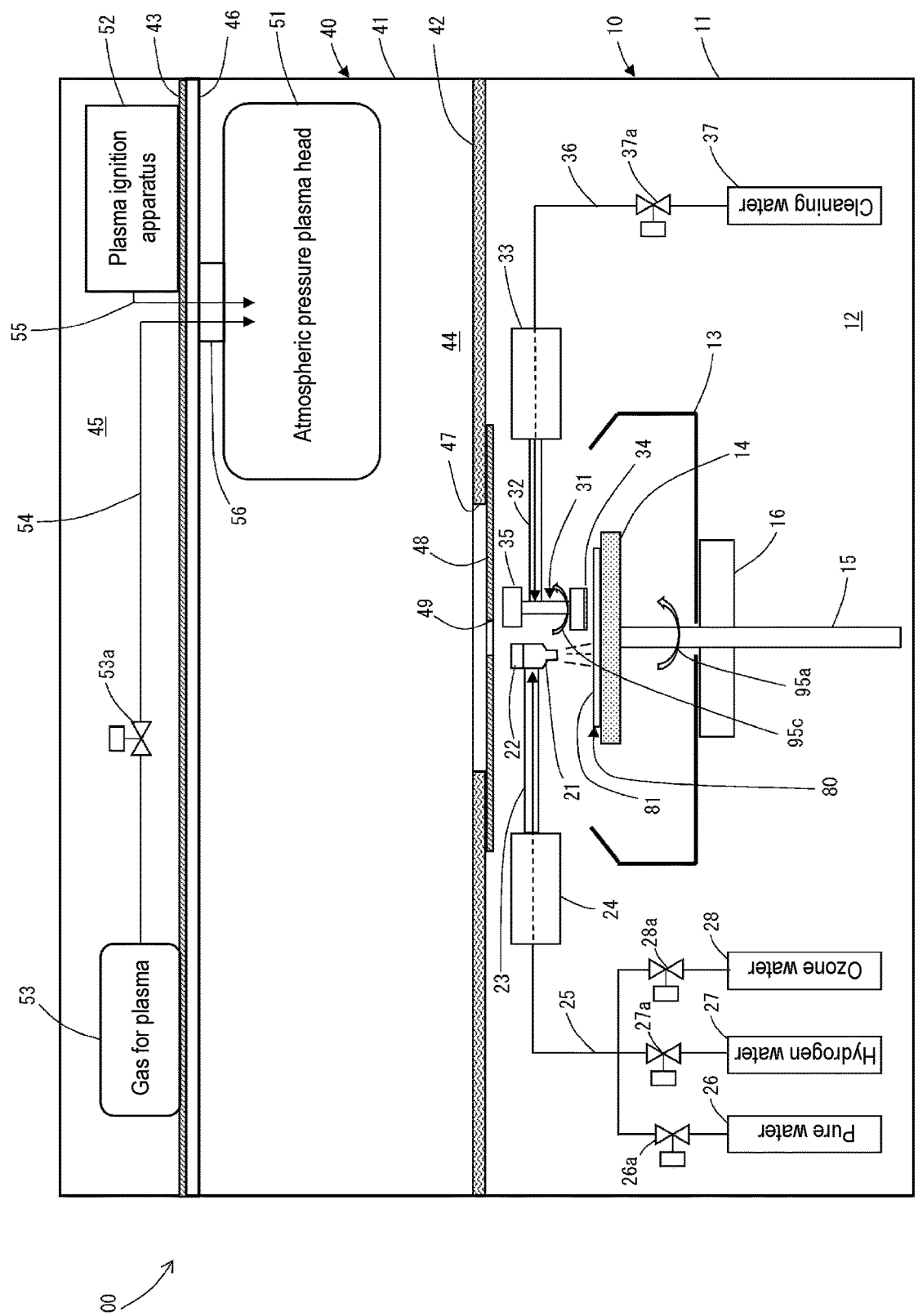
FIG. 7 is a view showing the operation of the electronic component cleaning apparatus shown in FIG. 3, and is an elevation cross-sectional view during wet cleaning.

As shown in FIG. 7, the control unit 17 operates the nozzle arm drive part 24 to rotate the nozzle arm 23 to move the water nozzle 21 above the processing stage 14. Then, the control unit 17 rotates the processing stage 14 by the stage drive apparatus 16, opens the hydrogen water valve 27a, and sprays hydrogen water from the water nozzle 21 toward the wafer 80 to clean the wafer 80. At this time, the control unit 17 operates the ultrasonic vibrator 22 to apply ultrasonic vibrations to the hydrogen water, and sprays the ultrasonically vibrated hydrogen water onto the surface of the wafer 80.

Next, the control unit 17 performs wiping cleaning with pure water in step S103 of FIG. 5. As shown in FIG. 7, the control unit 17 operates the head arm drive part 33 to rotate the head arm 32 to move the wiping head 31 above the processing stage 14. Since the water nozzle 21 has moved to be above the processing stage 14 during the previous hydrogen water cleaning, the control unit 17 opens the pure water valve 26*a* to spray pure water from the water nozzle 21 toward the wafer 80, and also operates the rotary pressing drive part 35 of the wiping head 31 to drive and rotate the wiping member 34 while bringing it into contact with the upper surface of the wafer 80. The control unit 17 moves the wiping head 31 along the surface 81 of the wafer 80 by the head arm drive part 33 to wipe and clean the surface 81 of the wafer 80. At this time, the control unit 17 may open the cleaning water valve 37*a* to spray cleaning water from the wiping head 31 while wiping clean the surface 81 of the wafer 80.

Next, the control unit 17 executes the hydrogen water cleaning again in step S104 of FIG. 5, like step S102 of FIG. 5.

Inorganic and organic foreign matters are removed from the surface 81 of the wafer 80 by wet cleaning from step S102 to step S104 of FIG. 5.

After completing the wet cleaning, the control unit 17 transports the wet cleaned wafer 80 from the wet cleaning chamber 13 to the dry cleaning chamber 44 in steps S105 to S108 of FIG. 5.

The control unit 17 opens the shutter 48 in step S105 of FIG. 5. Further, the control unit 17 operates the nozzle arm drive part 24 and the head arm drive part 33 to retract the nozzle arm 23, the head arm 32, the water nozzle 21 and the wiping head 31 to a position where they do not overlap the processing stage 14. After opening the shutter 48 as shown in FIG. 8, in step S107 of FIG. 5, the control unit 17 operates the stage drive apparatus 16 as shown in FIG. 8 to raise the processing stage 14 as indicated by an arrow 95*d* in FIG. 8. In this way, the control unit 17 moves the processing stage 14 from the wet clean chamber 13 into the dry clean chamber 44 and transports the wafer 80 from the wet clean chamber 13 into the dry clean chamber 44.

The control unit 17 closes the shutter 48 in step S108 of FIG. 5 when the processing stage 14 is moved into the dry cleaning chamber 44.

Figure 9:
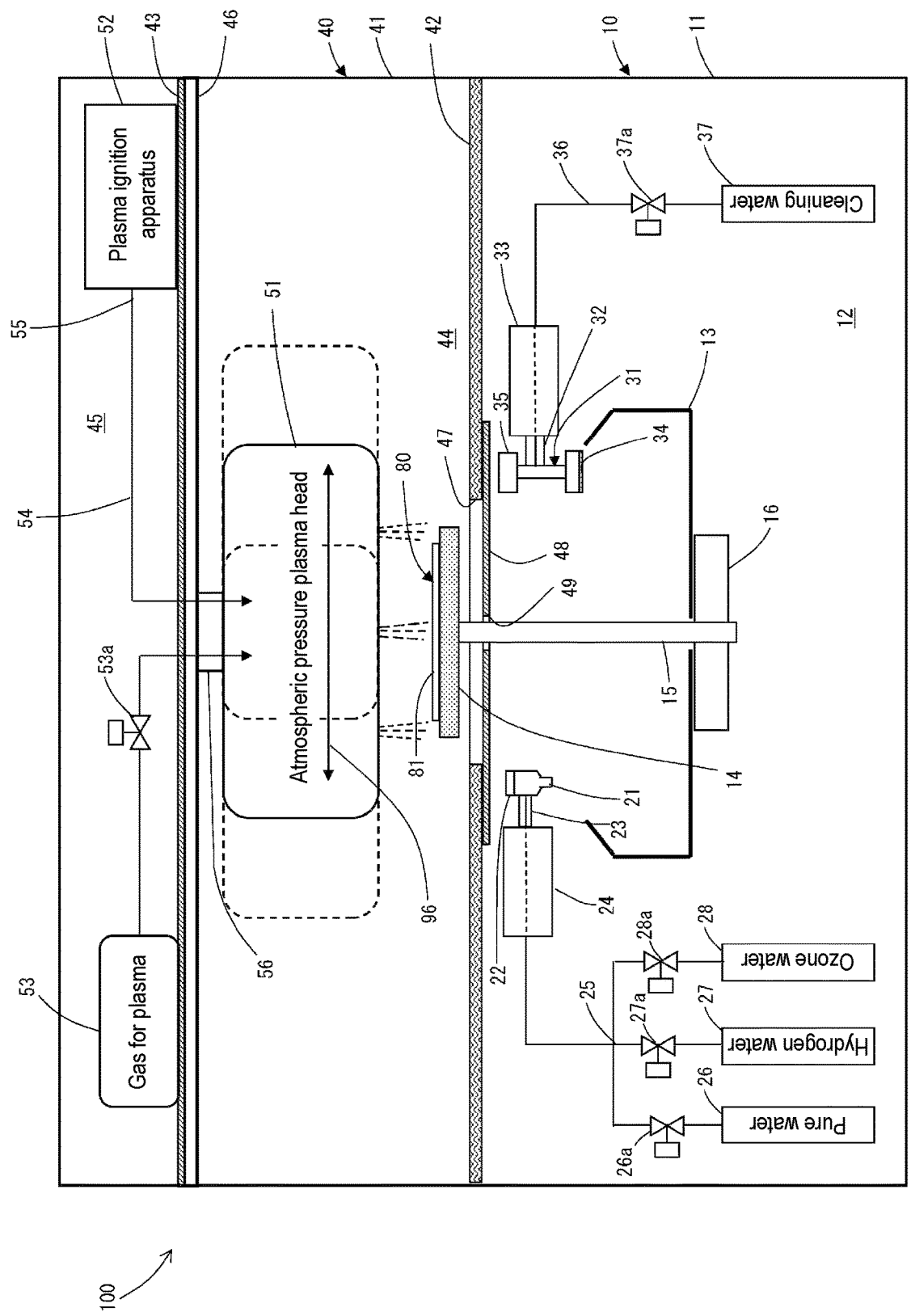
FIG. 9 is a view showing the operation of the electronic component cleaning apparatus shown in FIG. 3, and is an elevation cross-sectional view during dry cleaning.

Next, the control unit 17 performs dry cleaning with atmospheric pressure plasma in step S109 of FIG. 5. Here, step S109 of FIG. 5 configures a dry cleaning process. The control unit 17 operates the plasma head drive part 56 to move the atmospheric pressure plasma head 51 above the processing stage 14 as shown in FIG. 9. Then, the control unit 17 operates the plasma ignition apparatus 52 to supply a high voltage to the atmospheric pressure plasma head 51 from the plasma ignition apparatus 52, opens the plasma gas valve 53*a* to supply gas for plasma from the plasma gas tank 53 to the atmospheric pressure plasma head 51 to generate atmospheric pressure plasma in the atmospheric pressure plasma head 51. Then, the control unit 17 operates the plasma head drive part 56 to reciprocally move the atmospheric pressure plasma head 51 above the wafer 80 as indicated by an arrow 96 in FIG. 9 to spray atmospheric pressure plasma onto the surface 81 of the wafer 80.

Dry cleaning in step S109 of FIG. 5 removes foreign matters adhering to the surface 81 of the wafer 80 by irradiation with atmospheric pressure plasma, and the surface of the wafer 80 is hydrophilized. Therefore, after dry cleaning, the hydrophilicity of the surface 81 of the wafer 80 is high.

Next, the control unit 17 transports the dry cleaned wafer 80 from the dry cleaning chamber 44 to the wet cleaning chamber 13 in steps S110 to S112 of FIG. 5. As described above, the control unit 17 opens the shutter 48 in step S110 of FIG. 5, operates the stage drive apparatus 16 to lower the processing stage 14 in step S111 of FIG. 5, and moves the processing stage 14 from the dry clean chamber 44 into the wet clean chamber 13 to transport the wafer 80 from the dry clean chamber 44 into the wet clean chamber 13. Then, the control unit 17 closes the shutter 48 in step S112 of FIG. 5.

Figure 10:
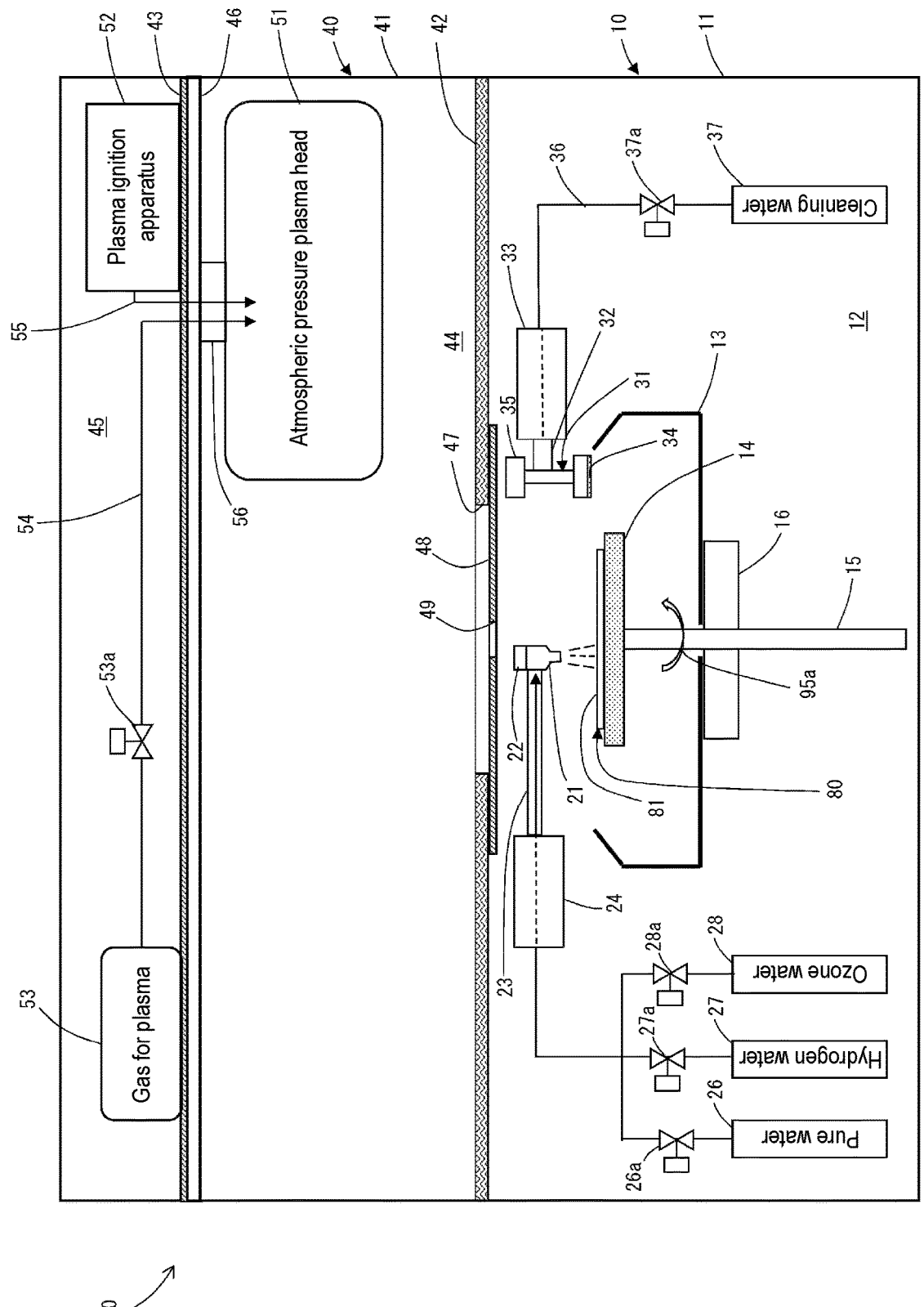
FIG. 10 is a view showing the operation of the electronic component cleaning apparatus shown in FIG. 3, and is a cross-sectional view during hydrogen water treatment.

Next, the control unit 17 proceeds to step S113 of FIG. 5 to hydrophilize the surface 81 by hydrogen water treatment. Here, step S113 of FIG. 5 configures a hydrogen water treatment process. As in the hydrogen water cleaning described in step S102 of FIG. 5, as shown in FIG. 10, the nozzle arm drive part 24 is operated to rotate the nozzle arm 23; the water nozzle 21 is moved above the processing stage 14; the processing stage 14 is rotated by the stage drive apparatus 16; and the hydrogen water valve 27*a* is opened to spray hydrogen water from the water nozzle 21 toward the wafer 80 to perform the hydrogen water treatment of the wafer 80. At this time, the control unit 17 operates the ultrasonic vibrator 22 to apply ultrasonic vibrations to the hydrogen water, and sprays the ultrasonically vibrated hydrogen water onto the surface of the wafer 80.

Though similar to the hydrogen water cleaning in steps S102 and S104 of FIG. 5, the hydrogen water treatment does not remove foreign matter from the surface 81 of the wafer 80, but rather performs hydrophilization treatment on the surface 81, and the treatment time is shorter than the hydrogen water cleaning in steps S102 and S104 of FIG. 5.

After completing the hydrogen water treatment, the control unit 17 proceeds to step S114 of FIG. 5 to perform a spin drying treatment. The control unit 17 causes the stage drive apparatus 16 to rotate the processing stage 14 at high speed, and the hydrogen water remaining on the surface 81 of the wafer 80 is blown away by centrifugal force to dry the surface 81.

After completing the spin drying treatment, the control unit 17 proceeds to step S115 of FIG. 5, and transports the wafer 80 out of the wet cleaning unit 10. The control unit 17 operates the horizontal transport robot 64 shown in FIG. 1 to pick up the cleaned wafer 80 placed on the upper surface of the processing stage 14, transports it out of the wet cleaning unit 10 and places the wafer 80 on the wafer transfer stage 63 of the horizontal transport unit 60.

Next, the change in hydrophilicity of the surface 81 of the wafer 80 will be described with reference to FIG. 11. The solid line a in FIG. 11 indicates the change over time of the pure water contact angle of the surface 81 when hydrophilization with hydrogen water treatment was performed immediately after dry cleaning with atmospheric pressure plasma was performed, like the cleaning operation of the wafer 80 of the electronic component cleaning apparatus 100 of the embodiment described above. Further, the dashed line b in FIG. 11 indicates the change over time of the pure water contact angle of the surface 81 when only dry cleaning with atmospheric pressure plasma is performed.

Here, the pure water contact angle is the angle formed by the liquid surface and the surface 81 at the place where the free surface of stationary pure water contacts the surface 81, and when the pure water contact angle is large, the hydrophilicity is low, and when the pure water contact angle is small, the hydrophilicity is high.

First, the change in the pure water contact angle and hydrophilicity of the surface 81 when only dry cleaning with atmospheric pressure plasma is performed as indicated by the dashed line b in FIG. 11 will be described.

Figure 11:
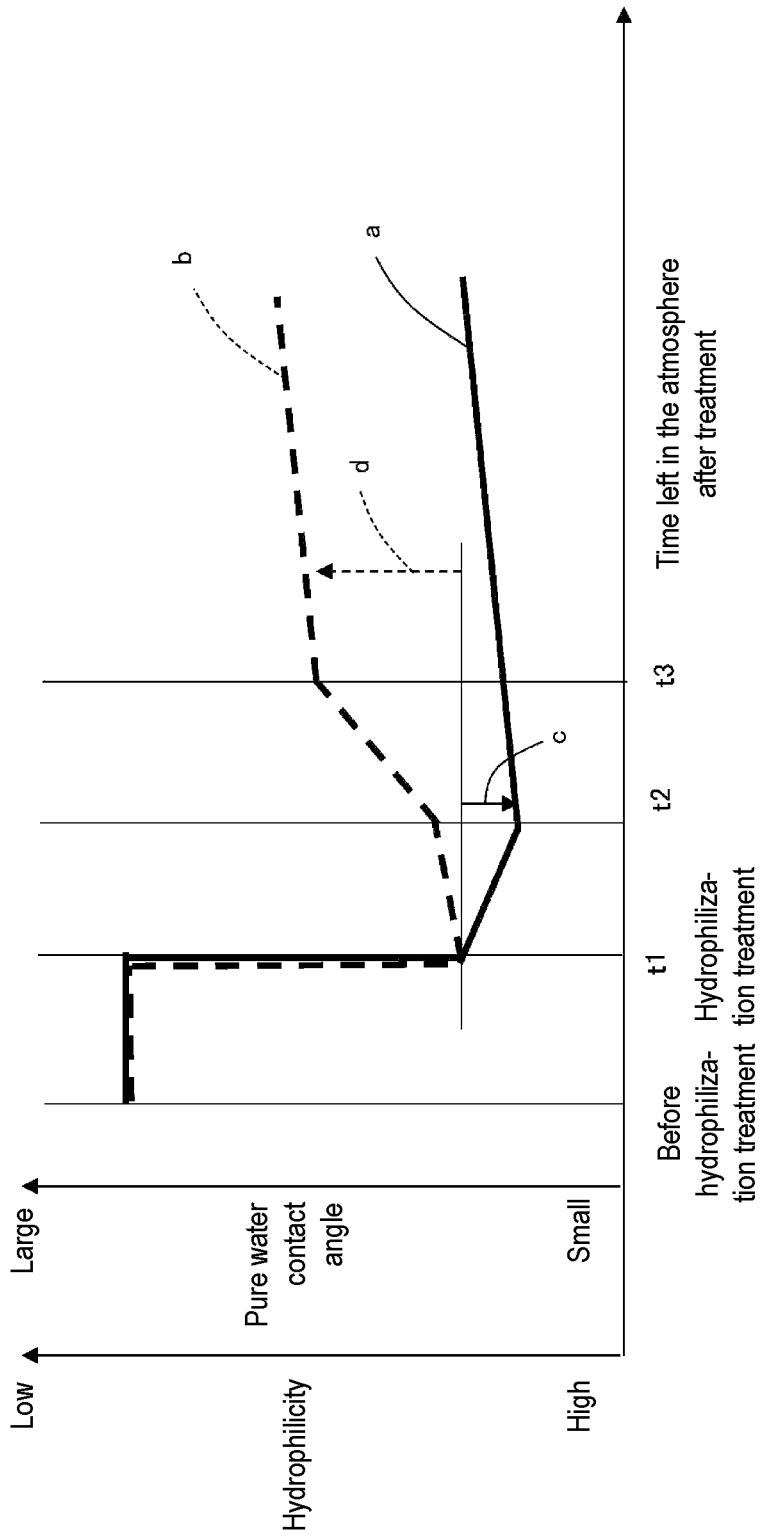
FIG. 11 is a graph showing changes over time in pure water contact angle and hydrophilicity after dry cleaning with atmospheric pressure plasma, and changes over time in pure water contact angle and hydrophilicity after hydrogen water treatment when hydrogen water treatment is performed after dry cleaning with atmospheric pressure plasma.

When dry cleaning with atmospheric pressure plasma is performed at time t1 in FIG. 11, foreign matters on the surface 81 are removed by the irradiation of the atmospheric pressure plasma, and the surface 81 is hydrophilized, and the pure water contact angle is greatly reduced from that before dry cleaning. That is, the hydrophilicity is increased. When the wafer 80 is left in the atmosphere after dry cleaning with atmospheric pressure plasma, the pure water contact angle gradually increases over time from time t1 when dry cleaning is completed to time t2. After time t2 and before time t3, the pure water contact angle increases more than between time t1 and time t2. Then, after time t3, the pure water contact angle gently increases again.

Thus, when the wafer 80 is left in the atmosphere after dry cleaning is performed with atmospheric pressure plasma, as shown by an arrow d in FIG. 11, the pure water contact angle of the surface of the wafer 80 shifts to a state higher than that at the end of dry cleaning between time t2 and time t3, and then gradually increases. In terms of changes in hydrophilicity, the hydrophilicity of the surface 81 of the wafer 80 shifts to a state lower than that at the end of the hydrophilization between time t2 and time t3, and then gradually decreases.

In addition, when hydrophilization with hydrogen water treatment is performed immediately after dry cleaning with atmospheric pressure plasma, as shown by an arrow c in FIG. 11, between time t1 when hydrogen water treatment is completed and time t2, even if the wafer 80 is left in the atmosphere, the pure water contact angle of the surface 81 gradually decreases, and after time t2, the pure water contact angle of the surface 81 gradually increases. In terms of changes in hydrophilicity, the hydrophilicity of the surface 81 gradually increases from time t1 when the hydrogen water treatment is completed to time t2, and after time t2, the hydrophilicity of the surface 81 gradually decreases.

Therefore, when hydrophilization with hydrogen water treatment is performed immediately after dry cleaning with atmospheric pressure plasma, hydrophilicity higher than hydrophilicity at the end of hydrogen water treatment may be maintained for a long time.

The reason why the hydrophilicity increases over time after the completion of the hydrogen water treatment is thought to be that hydroxyl groups are attached to the surface 81 of the wafer 80 by the hydrogen water treatment. Here, according to research by the inventors, if the time from dry cleaning with atmospheric pressure plasma to the start of hydrophilization with hydrogen water treatment is not short, it is known that the effect of increasing the hydrophilicity over time cannot be obtained after the completion of the hydrogen water treatment as described above.

For this reason, in the electronic component cleaning apparatus 100 of the embodiment, the dry cleaning unit 40 is disposed to overlap the wet cleaning unit 10 on top of it, and the processing stage 14 is moved up and down to move the wafer 80 between the dry cleaning unit 40 and the wet cleaning unit 40, whereby the interval between the dry cleaning with the atmospheric pressure plasma and the hydrophilization with the hydrogen water treatment is shortened. In this way, in the electronic component cleaning apparatus 100 of the embodiment, hydrophilization with hydrogen water treatment may be started immediately after the dry cleaning with atmospheric pressure plasma is completed, more specifically, 5 to 10 seconds after the dry cleaning is completed. Therefore, the electronic component cleaning apparatus 100 of the embodiment may maintain the hydrophilicity of the surface 81 of the wafer 80 in a high state for a long time, and may improve the bonding quality.

Next, an electronic component cleaning apparatus 200 of another embodiment will be described with reference to FIGS. 12 to 14. The same parts as those of the electronic component cleaning apparatus 100 described above with reference to FIGS. 1 to 11 are denoted by the same reference numerals, and the description thereof is omitted.

Figure 12:
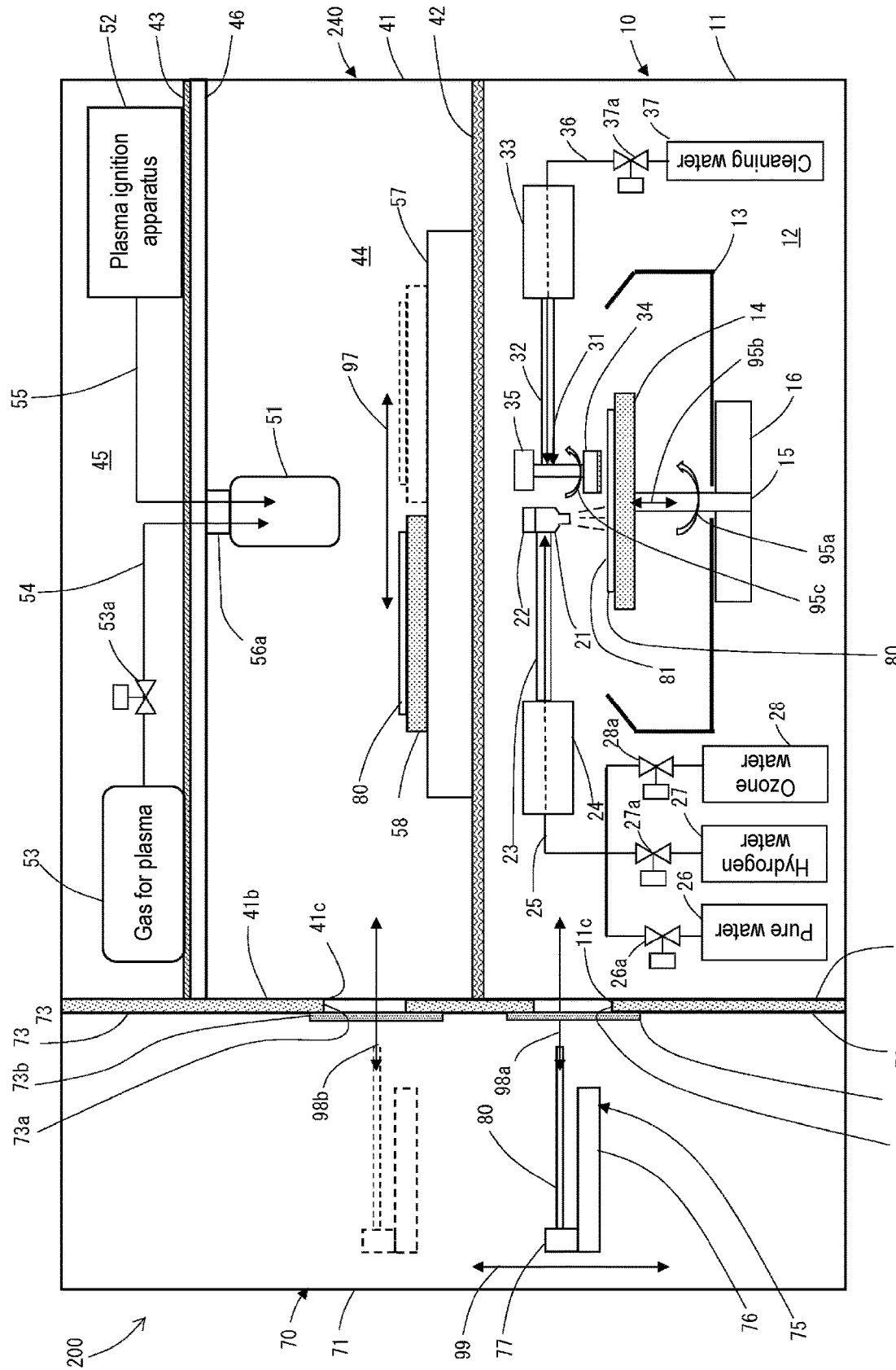
FIG. 12 is an elevation cross-sectional view of an electronic component cleaning apparatus of another embodiment.

The electronic component cleaning apparatus 200 shown in FIG. 12 includes a vertical transport unit 70 adjacent to side walls 11b and 41b of a wet cleaning unit 10 and a dry cleaning unit 240 which are disposed one above the other. The vertical transport unit 70 transports the wafer 80 between the wet cleaning chamber 13 and the dry cleaning chamber 44. The electronic component cleaning apparatus 200 also includes a control unit 17, which is not shown in FIG. 12.

The vertical transport unit 70 includes a casing 71 and a vertical transport apparatus 75 disposed inside the casing 71.

The casing 71 is a substantially rectangular parallelepiped member which is disposed adjacent to the side surfaces of the wet cleaning unit 10 and the dry cleaning unit 240 and which extends in the up-down direction across the wet cleaning unit 10 and the dry cleaning unit 240. A first-floor side wall 72 of the casing 71 is provided with an opening 72a that communicates with an opening 11c of the side wall 11b of the casing 11 of the wet cleaning unit 10. Similarly, a second-floor side wall 73 is provided with an opening 73a that communicates with an opening 41c of the side wall 41b of the casing 41 of the dry cleaning unit 240. Shutters 72b and 73b are attached to the openings 72a and 73a, respectively.

The vertical transport apparatus 75 is disposed inside the casing 71 to move the wafer 80 into and out of the wet cleaning chamber 13 and the dry cleaning chamber 44, and to transport the wafer 80 between the wet cleaning chamber 13 and the dry cleaning chamber 44.

As shown in FIG. 12, the vertical transport apparatus 75 includes a main body 76 that moves in the up-down direction as indicated by an arrow 99 in FIG. 12, and a chuck 77 that is mounted on the main body 76 and slides in the horizontal direction. The chuck 77 grips the wafer 80 and reciprocally moves in the horizontal direction as indicated by arrows 98a and 98b shown in FIG. 12.

The wet cleaning unit 10 has the same configuration as the wet cleaning unit 10 of the electronic component cleaning apparatus 100 described above with reference FIGS. 1 to 11 except that the side wall 11b of the casing 11 is provided with the opening 11c.

The dry cleaning unit 240 includes a processing stage 58 that holds the wafer 80 inside the dry cleaning chamber 44, and a slide drive part 57 that reciprocally moves the processing stage 58 in the direction of an arrow 97 shown in FIG. 12. The atmospheric pressure plasma head 51 is attached to the ceiling rail 46 with a bracket 56a, and unlike the dry cleaning unit 40 described above with reference to FIGS. 1 to 11, the atmospheric pressure plasma head 51 does not move reciprocally. Further, the side wall 41b of the casing 41 is provided with the opening 41c.

Figure 13:
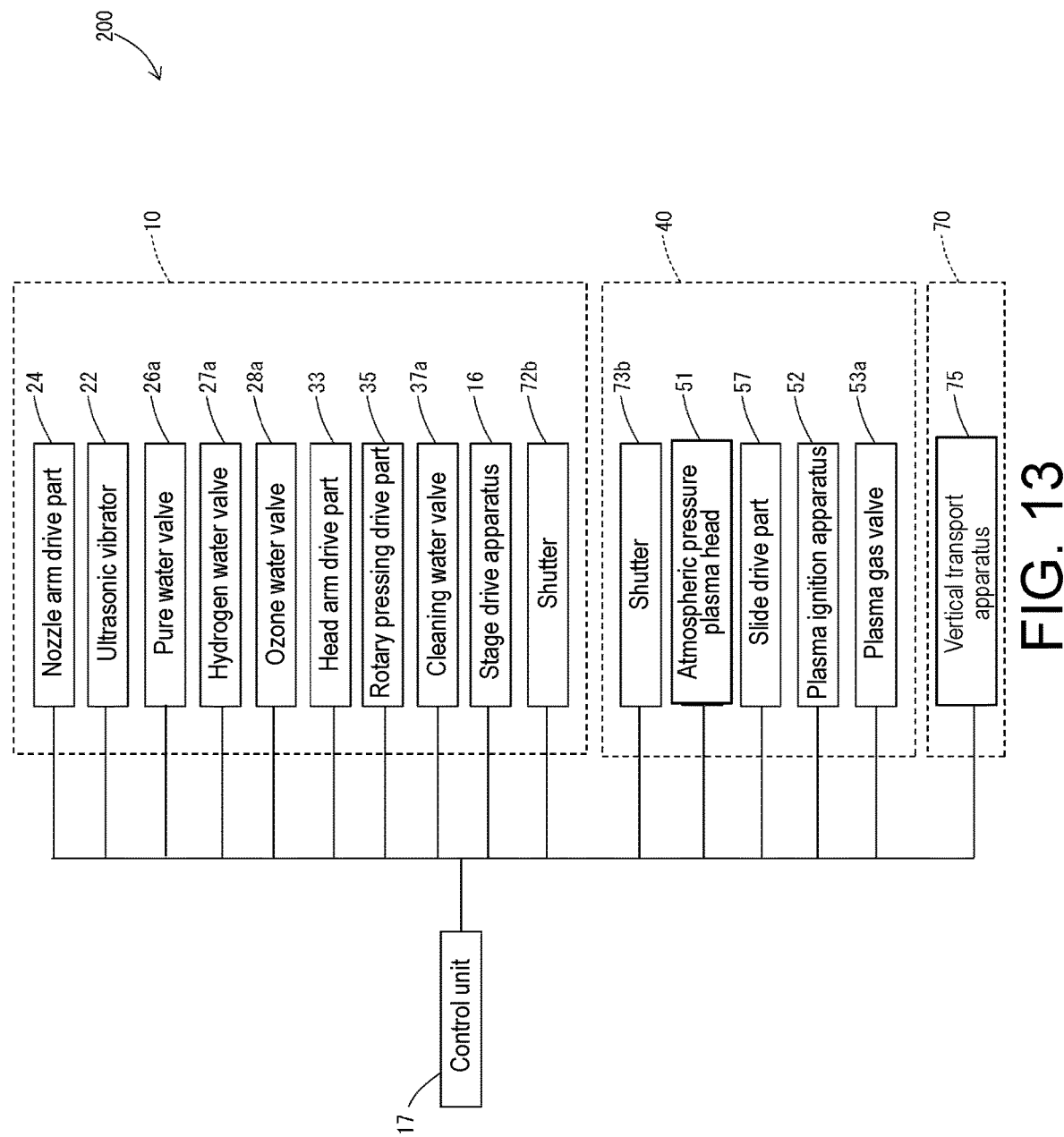
FIG. 13 is a system view showing a control system of the electronic component cleaning apparatus of another embodiment.

As shown in FIG. 13, in the electronic component cleaning apparatus 200, the control unit 17 is connected to the nozzle arm drive part 24 of the wet cleaning unit 10, the ultrasonic vibrator 22, the pure water valve 26a, the hydrogen water valve 27a, the ozone water valve 28a, the head arm drive part 33, the rotary pressure drive part 35, the cleaning water valve 37a, the stage drive apparatus 16, and the shutter 72b to adjust the operation of each equipment of the wet cleaning unit 10. Further, the control unit 17 is connected to the atmospheric pressure plasma head 51, the slide drive part 57, the plasma ignition apparatus 52, the plasma gas valve 53a, and the shutter 73b to adjust the operation of each equipment of the dry cleaning unit 40. Further, the control unit 17 is connected to the vertical transport apparatus 75 of the vertical transport unit 70 to adjust the operation of the vertical transport apparatus 75.

Next, the cleaning operation of the wafer 80 of the electronic component cleaning apparatus 200 configured as described above will be described with reference to FIG. 14. The same step numbers are assigned to the same operations as those of the electronic component cleaning apparatus 100 described above with reference to FIG. 5, and the description thereof is omitted.

Figure 14:
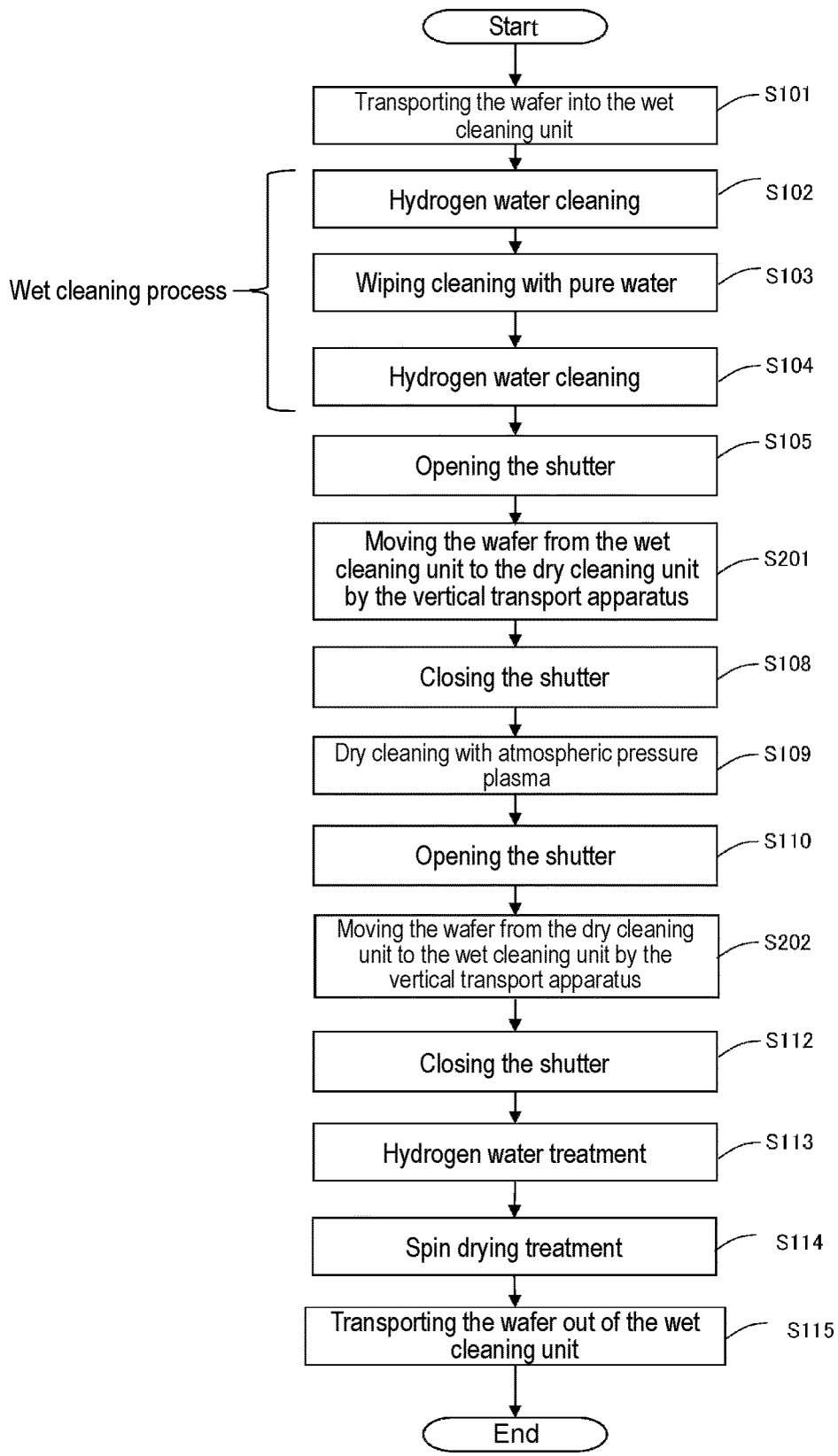
FIG. 14 is a flow chart showing the operation of the electronic component cleaning apparatus of another embodiment.

In step S101 of FIG. 14, the control unit 17 of the electronic component cleaning apparatus 200 operates the vertical transport apparatus 75 to transport the wafer 80 into the wet cleaning unit 10, and performs wet cleaning in steps S102 to S104 of FIG. 14, like the electronic component cleaning apparatus 100.

When the wet cleaning is completed, the control unit 17 opens the shutters 72b and 73b in step S105 of FIG. 14, operates the vertical transport apparatus 75 in step S201 of FIG. 14, and transports the wafer 80 from the wet cleaning unit 10 to the dry cleaning unit 240. Then, when the transportation of the wafer 80 is completed, the control unit 17 closes the shutters 72b and 73b in step S108 of FIG. 14. Then, in step S109 of FIG. 14, the control unit 17 performs dry cleaning by reciprocally moving the processing stage 58 holding the wafer 80 on its upper surface by the slide drive part 57. When the dry cleaning is completed, the control unit 17 opens the shutters 72b and 73b in step S110 of FIG. 14, and transports the wafer 80 to the wet cleaning unit 10 by the vertical transport apparatus 75 in step S202 of FIG. 14. Then, the control unit 17 closes the shutters 72b and 73b in step S112 of FIG. 14, proceeds to step S113 of FIG. 14, and performs hydrogen water treatment in the wet cleaning unit 10. Then, after the spin drying treatment in step S114 of FIG. 14, the control unit 17 transports the wafer 80 from the wet cleaning unit 10 by the vertical transfer apparatus 75 in step S115 of FIG. 14.

The electronic component cleaning apparatus 200, like the electronic component cleaning apparatus 100, may start hydrophilization with hydrogen water treatment immediately after the end of dry cleaning with atmospheric pressure plasma; therefore, the hydrophilicity of the surface 81 of the wafer 80 may be maintained in a high state, and the bonding quality may be improved.

Figure 15:
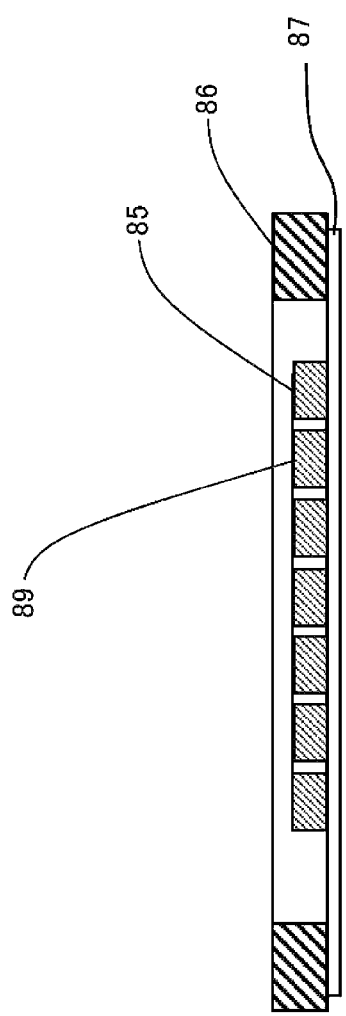
FIG. 15 is a cross-sectional view showing a semiconductor chip attached on a dicing film and a ring attached with the dicing film.

In the above description, the electronic component cleaning apparatuses 100 and 200 clean the surface 81 of the wafer 80, but they may clean the surface of the semiconductor chip 85. As shown in FIG. 15, the semiconductor chip 85 is obtained by attaching a dicing film 87 made of silicon as a support material to the lower surface of the disk-shaped wafer 80 and cutting the wafer 80 from the upper side with a dicing saw in a grid pattern. Further, the upper surface of the outer circumference of the dicing film 87 is attached to a ring 86. Therefore, the semiconductor chip 85 is handled together with the ring 86 while being attached to the upper surface of the dicing film 87. The reference numeral 89 shown in FIG. 15 indicates the surface 89 of the semiconductor chip 85. Further, the semiconductor chip 85 is not limited to being attached on the dicing film 87, and may be attached on a silicon wafer, a glass plate, or a substrate.

In the above description, the wet cleaning is performed using hydrogen water, but the it is not limited thereto, and ozone water may be used. Further, in the hydrogen water cleaning and the hydrogen water treatment, the hydrogen water may be sprayed onto the surface 81 of the wafer 80 without being applied with ultrasonic vibration.

What is claimed is:

1. An electronic component cleaning apparatus for cleaning a surface of an electronic component, comprising:
    a wet cleaning unit that performs wet cleaning of the surface of the electronic component with liquid;
    a dry cleaning unit that performs dry cleaning of the surface of the electronic component with atmospheric pressure plasma;
    a transport unit that transports the electronic component between the wet cleaning unit and the dry cleaning unit; and
    a control unit that adjusts operations of the wet cleaning unit, the dry cleaning unit, and the transport unit,
    wherein the control unit:
    performs the wet cleaning of the surface of the electronic component with liquid by the wet cleaning unit at a first position;
    transports the electronic component that has been wet-cleaned by the transport unit to the dry cleaning unit;
    performs the dry cleaning of the surface of the electronic component with atmospheric pressure plasma by the dry cleaning unit at a second position;
    transports the electronic component that has been dry-cleaned by the transport unit to the wet cleaning unit; and
    performs a hydrogen water treatment by the wet cleaning unit to hydrophilize the surface of the electronic component by supplying hydrogen water in which hydrogen gas is dissolved in water to the surface of the electronic component,
    wherein the control unit controls the transport unit to transport the electronic component to the dry cleaning unit and performs the dry cleaning with the atmospheric pressure plasma at the second position, and then the control unit transports the electronic component to the wet cleaning unit and performs the wet cleaning with the hydrogen water at the first position after the dry cleaning with the atmospheric pressure plasma is performed at the second position.

2. The electronic component cleaning apparatus according to claim 1, wherein the control unit transports the electronic component that has been dry-cleaned from the dry cleaning unit to the wet cleaning unit by the transport unit to start the hydrogen water treatment immediately after the dry cleaning is completed.

3. The electronic component cleaning apparatus according to claim 2, wherein the control unit transports the electronic component that has been dry-cleaned from the dry cleaning unit to the wet cleaning unit by the transport unit to start the hydrogen water treatment within 30 seconds after the dry cleaning is completed.

4. The electronic component cleaning apparatus according to claim 3, wherein the control unit transports the electronic component that has been dry-cleaned from the dry cleaning unit to the wet cleaning unit by the transport unit to start the hydrogen water treatment within 10 seconds after the dry cleaning is completed.

5. The electronic component cleaning apparatus according to claim 1, wherein the dry cleaning unit is disposed above the wet cleaning unit to overlap at least a part of the wet cleaning unit, and the transport unit is a stage that holds the electronic component on its upper surface and is driven in an up-down direction while holding the electronic component.

6. The electronic component cleaning apparatus according to claim 1, wherein the dry cleaning unit is disposed above the wet cleaning unit to overlap at least a part of the wet cleaning unit, and
the transport unit is disposed adjacent to the wet cleaning unit and the dry cleaning unit, extends in an up-down direction across the wet cleaning unit and the dry cleaning unit, and transports the electronic component between the wet cleaning unit and the dry cleaning unit.

7. The electronic component cleaning apparatus according to claim 1, wherein the electronic component is a wafer, a semiconductor chip, or a substrate for a semiconductor device.

8. The electronic component cleaning apparatus according to claim 7, wherein the semiconductor chip is attached on a support material.

\* \* \* \* \*